XR 3,755,671 SR TX 3093T

United Stat

Lockwood

[11] 3,755,671

[45] Aug. 28, 1973

[54] METHOD OF PROVIDING A SEMICONDUCTOR BODY WITH PIEZOELECTRIC PROPERTIES

[75] Inventor: Harry Francis Lockwood, New York, N.Y.

[73] Assignee: RCA Corporation, New York, N.Y.

[22] Filed: Sept. 29, 1972

[21] Appl. No.: 293,580

[52] U.S. Cl...................250/492, 29/25.35, 148/1.5, 310/8, 317/235 M, 350/161

[51] Int. Cl............................................... H01j 37/00

[58] Field of Search..................... 29/25.35; 148/1.5; 250/49.5 R, 49.5 TE; 317/235 M; 252/62.3, 62.9; 310/8; 331/94.5; 350/161

[56] References Cited

UNITED STATES PATENTS

| | | | |
|---|---|---|---|
| 3,539,401 | 11/1970 | Yamashita | 29/25.35 X |
| 3,570,112 | 3/1971 | Barry et al. | 250/49.5 X |
| 3,689,782 | 9/1972 | Epszein | 250/49.5 X |
| 3,691,376 | 9/1972 | Bauerlein et al. | 250/49.5 |

*Primary Examiner*—William F. Lindquist
*Attorney*—Glenn H. Bruestle and Donald S. Cohen

[57] ABSTRACT

Semiconductor crystalline materials which lack a center of symmetry but which contain mobile carriers are provided with piezoelectric properties by bombarding the materials with electrons. A body of such semiconductor material can be bombarded with electrons on selected portions thereof so that the unbombarded portions of the body have semiconductor properties and the bombarded portions have piezoelectric properties.

4 Claims, 4 Drawing Figures

3755671
OR IN 250/492R

METHOD OF PROVIDING A SEMICONDUCTOR BODY WITH PIEZOELECTRIC PROPERTIES

BACKGROUND OF THE INVENTION

The present invention relates to a method of providing semiconductor crystalline materials which lack a center of symmetry but which contain mobile carriers with piezoelectric properties. More particularly, the present invention relates to providing selected portions of a body of such a semiconductor material with piezoelectric properties.

Semiconductor crystals which lack a center of symmetry, such as the group III–V compounds and mixtures thereof, are normally piezoelectric. However, the presence of mobile carriers (electrons) in these semiconductor crystals tends to screen the piezoelectric voltage. Such mobile electrons occur in the semiconductor materials which include a conductivity modifier. Thus, these semiconductor materials which contain conductivity modifiers to make active semiconductor devices do not have piezoelectric properties. However, for certain types of acoustical and optoacoustical devices it would be desirable to have a body of the semiconductor material which has portions which are piezoelectric and portions which are semiconductive.

SUMMARY OF THE INVENTION

A body of a crystalline semiconductor material which lacks a center of symmetry but which contains screening mobile electrons is bombarded with electrons until the mobile electrons in the bombarded portion of the body are sufficiently compensated to stimulate the latent piezoelectricity in the said portion of the body.

DETAILED DESCRITION

I have discovered that a normally piezoelectric crystalline semiconductor material which lacks a center of symmetry but which contains screening mobile carriers (electrons) can be provided with the piezoelectric properties by bombarding the semiconductor material with electrons. The semiconductor materials which lack a center of symmetry are generally the group III-V compounds, such as the arsenide, phosphide, and antimonides of gallium, aluminum and indium, and mixtures of such compounds. The mobile electrons result from the semiconductor material containing a conductivity modifier. The semiconductor material is bombarded with the electrons to introduce a sufficient number of acceptor states to sufficiently compensate the free carriers and thus stimulate the latent piezoelectricity of the semiconductor material. The dosage of bombarding electrons with respect to energy and total number necessary to achieve piezoelectricity will vary depending on the volume of the semiconductor material and the concentration of the free carriers. When a particular body of a semiconductor material has been sufficiently bombarded with electrons can be determined by testing the body for piezoelectric properties.

Figure 1:
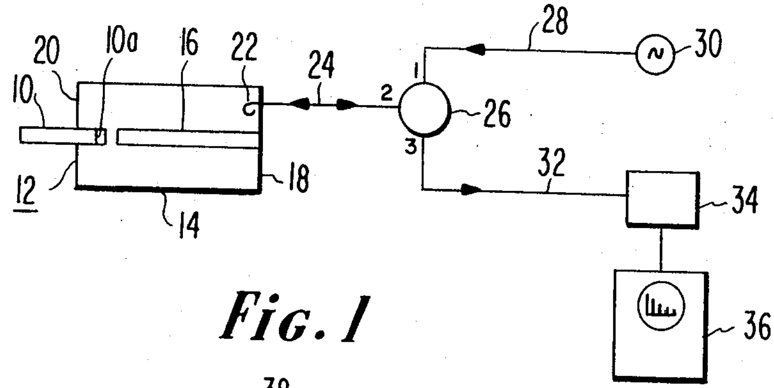
FIG. 1 is a schematic view of a circuit used in testing a device made by the method of the present invention.

As an example of the method of the present invention, a body of N type gallium arsenide having a carrier concentration of about $10^{17}cm^{-3}$ and being 0.1 in. in diameter and 0.75 in. long was bombarded with electrons on an end surface. The end of the rod was bombarded with electrons with an energy of one million electron volts (MeV). This provided a thin, several mils thick, region at the end of the rod in which the free carriers were compensated by the defects introduced by the bombarding electrons. Using the circuit shown in FIG. 1, the rod, generally designated as 10, was tested for piezoelectricity before and after being bombarded with electrons. The circuit comprises a microwave cavity 12 having an outer cylindrical conductor wall 14 and an inner conductor rod 16 within and spaced from the outer conductor wall. The inner conductor rod 16 extends from one end 18 of the cavity 12 to a point short of the other end 20. A coupling loop input/output member 22 extends into the cavity at the end 18. The coupling loop member 22 is connected by a line 24 to the No. 2 port of a three port circulator 26. The No. 1 port of the circulator 26 is connected by a line 28 to an R.F. signal source 30. The No. 3 port of the circulator 26 is connected by a line 32 to a detector 34, such as a superheterodyne receiver. The output side of the detector 34 is connected to a cathode ray oscilloscope 36.

To test the rod 10, it was inserted in the end 20 of the cavity 12 in longitudinal alignment with the inner conductor rod 16 and with the electron bombarded end 10*a* being adjacent the end of the inner conductor rod 16. A 500Mhz R.F. pulse signal was supplied from source 30 to the No. 1 port of the circulator. This signal emerged from the No. 2 of the circulator 26 and entered the cavity 12 through the coupling loop member 22. This excited the cavity to create a high field region at the end 10*a* of the rod 10. The high field generated an acoustic wave in the piezoelectric end 10*a* of the rod 10. The acoustic wave traveled down the rod 10 to the other end and was reflected back along the rod 10. The returning acoustic wave excited the piezoelectric end 10*a* of the rod 10 to generate an R.F. pulse signal. This generated R.F. pulse signal passed from the cavity 10, entered the No. 2 port of the circulator 26 and emerged from the No. 3 port of the circulator. The pulse then passed to the detector 34 and was indicated as a vertical pulse on the oscilloscope 36. Not all of the reflected acoustic wave was converted into electromagnetic energy so that the remaining acoustic energy again traversed the rod 10 to generate a second or echo R.F. signal which appeared on the oscilloscope as a second pulse of smaller amplitude than the first pulse. There were additional echo signals so that the pattern which appeared on the oscilloscope was a plurality of pulses of decreasing amplitude. The rod 10 was tested in the same manner as described above in the circuit shown in FIG. 1 prior to being bombarded with electrons. In that test there was no indication of a signal on the oscilloscope. This showed that the bombarding of the rod with electrons provided a region which exhibits piezoelectricity.

Although the method of the present invention can be used to provide the entire body of the semiconductor material with piezoelectric properties, it is most useful for forming in a body of the semiconductor material discrete regions which are piezoelectric so that the body has regions with semiconductive properties and regions with piezoelectric properties. This permits making devices which require both semiconductive and piezoelectric characteristics in a single body. Each of FIGS. 2, 3 and 4 shows an example of one such device.

Figure 2:
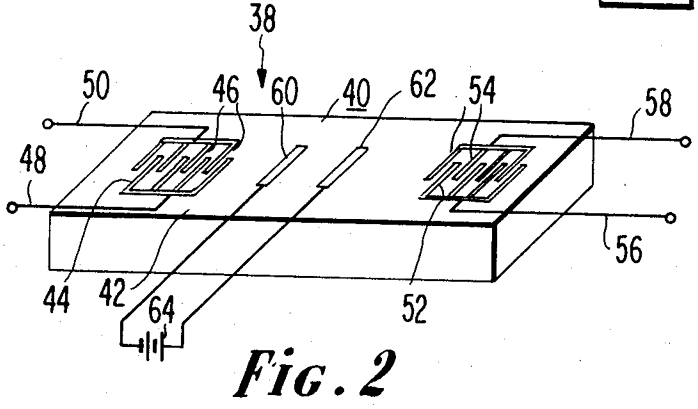
FIG. 2 is a perspective view of a surface acoustic wave delay line made by the method of the present invention.

Referring to FIG. 2, there is shown a surface wave amplifier which is generally designated as 38. The surface wave amplifier 38 comprises a body 40 of a semiconductor material which lacks a center of symmetry, such as a group III–V semiconductor compound or mixtures thereof, but which contains screening mobile carriers, resulting from an N type conductivity modifier. On a surface 42 of the body 40 and adjacent one end of the body are two sets of interdigitated metal film fingers 44 and 46. The fingers 44 are all connected to a terminal 48 and the fingers 46 are all connected to a terminal 50. The terminals 48 and 50 are connected to an R.F. signal source, not shown. Adjacent the other end of the body 40 on the surface 42 are two sets of interdigitated metal film fingers 52 and 54. The fingers 52 are all connected to a terminal 56 and the fingers 54 are connected to a terminal 58. A pair of spaced, parallel, metal film contacts 60 and 62 are on the surface 42 of the body 40 between the two pairs of interdigitated fingers. The contacts 60 and 62 are connected across a voltage source 64. The region of the body 40 directly beneath each pair of interdigitated fingers is made piezoelectric in accordance with the method of the present invention by bombarding the surface 42 of the body 40 at each of the regions with electrons.

In the use of the surface wave amplifier 38, an R.F. signal is applied to the set of interdigitated fingers 44 and 46. This creates an acoustic wave in the piezoelectric region of the body 40 directly beneath the fingers 44 and 46. The acoustic wave travels along the surface 42 of the body 40 across the contacts 60 and 62 to the piezoelectric region beneath the interdigitated fingers 52 and 54. This acoustic wave excites the piezoelectric region of the body beneath the interdigitated fingers 52 and 54 to generate an R.F. signal which passes from the amplifier through the terminals 56 and 58. The D.C. voltage across the contacts 60 and 62 creates a drift field for electrons in the portion of the body 40 between the contacts. As the acoustic wave crosses the drift field it is amplified. Thus, there is provided an amplified R.F. signal from the terminals 56 and 58. In the surface wave amplifier 38 in order to convert the R.F. input signal to acoustical energy and the acoustical energy back to an R.F. output signal portions of the semiconductor body 40 must have the free carriers therein compensated to that the portions are piezoelectric. However, to achieve the amplification there must be free carriers in the drift field at the contacts 60 and 62. By using the method of the present invention a body of the semiconductor material can be provided with regions which have both of the characteristics so that a surface wave amplifier can be made in a single body of the semiconductor material.

Figure 3:
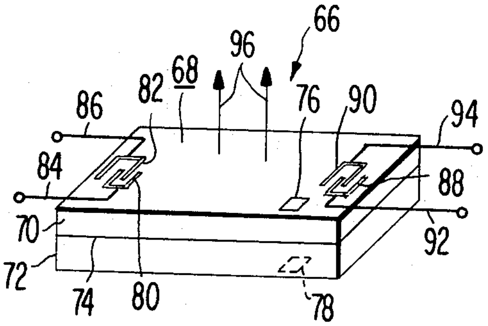
FIG. 3 is a perspective view of an electroluminescent semiconductor device made by the method of the present invention.
Figure 4:
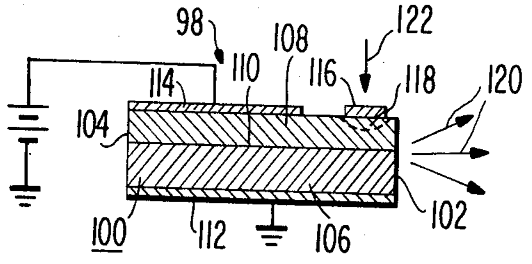
FIG. 4 is a sectional view of a semiconductor laser made by the method of the present invention.

Referring to FIG. 3 a semiconductor light emitter which is capable of being modulated is generally designated as 66. The semiconductor light emitter 66 comprises a body 68 of a group III–V semiconductor compound or mixtures thereof. The body 68 has juxtaposed regions 70 and 72 of opposite conductivity so as to provide a PN junction 74 at the interface between the regions. For example, the region 70 can be P type and the regions 72 can be N type. On the surface of the region 70 adjacent an edge of the body 68 is a metal contact 76. On the surface of the region 72 opposite to the contact 76 is a metal contact 78. The contacts 76 and 78 are connected across a source of D.C. voltage so that the PN junction 74 is forwardly biased. Two sets of interdigitated metal film fingers 80 and 82 respectively are on the surface of the region 70 adjacent one end of the body 68. The fingers 80 are all connected to a terminal 84 and the fingers 82 are all connected to a terminal 86. The terminals 84 and 86 are connected to an R.F. signal source. Two sets of interdigitated metal film fingers 88 and 90 are on the surface of the region 70 at the other end of the body 68. The fingers 88 are all connected to a terminal 92 and the fingers 90 are all connected to a terminal 94. The area of the region 70 directly under each pair of the interdigitated fingers is made piezoelectric in accordance with the method of the present invention by bombarding the surface of the region at each of the areas with electrons.

In the use of the semiconductor light emitter 66, a voltage is applied between the contacts 76 and 78 so that the PN junction 74 is forwardly biased. This causes charged carriers of one conductivity type to pass from the N type region 72 into the P type region 70 where they recombine with oppositely charged carriers and thereby generate light. The light is emitted from the P type region 70 as indicated by the arrows 96. An R.F. signal is applied to the pair of interdigitated fingers 80 and 82. This creates an acoustic wave in the piezoelectric area beneath the fingers 80 and 82. The acoustic wave travels across the surface of the region 70 to the piezoelectric area beneath the pair of interdigitated fingers 88 and 90. The acoustic wave excites the piezoelectric area beneath the fingers 88 and 90 to generate an R.F. signal which passes from the devices through the terminals 92 and 94. As the acoustic wave travels across the surface of the region 70 it crosses the path of the light being emitted and causes a spatial modulation of the light. In the semiconductor light emitter 66 in order to create an acoustical wave in the semiconductor body 68 these must be areas in which the free carriers are compensated so that the areas are piezoelectric. However, to achieve the generation of light in the body 68 there must be free carriers. By using the method of the present invention, the body 66 of the semiconductor material can be provided with areas which have both of these characteristics so that the light emitter with modulation can be made in a single body of the semiconductor material.

Referring to FIG. 4 a semiconductor laser which is capable of being modulated is generally designated as 98. The laser 98 comprises a body 100 of a group III–V semiconductor compound or mixtures thereof having opposed, parallel end surfaces 102 and 104. The body 100 includes two juxtaposed regions 106 and 108 of opposite conductivity type so as to form a PN junction 110 therebetween. The PN junction 110 extends to the end surfaces 102 and 104 of the body 100. The end surfaces 102 and 104 are partially optically transparent and partially reflective, such as being polished, so as to form a Fabry-Perot cavity within the body. The end surface 102 is preferably more transparent than the end surface 104, such as by coating the end surface 102 with an anti-reflective coating. A metal contact 112 is coated over the entire surface of the region 106 of the body 100. A metal contact 114 is coated on the surface of the region 108 of the body 100. The contact 114 extends from the end 104 of the body to a point spaced from the end 102. A metal film electrode 116 is on the surface of the region 108 adjacent the end 102 of the body 100. The portion 118 of the region 108 directly beneath the electrode 116 is made piezoelectric in accordance with the method of the present invention by bombarding the surface of that portion of the region with electrons.

In the use of the laser 98, the contacts 112 and 114 are connected across a D.C. voltage source so that the PN junction is forwardly biased. This causes the generation of light within the body 100 as a result of the recombination of oppositely charged free carriers. Since the body 100 is in the form of a Fabry-Perot cavity with the end 102 being more transparent than the end 104, the light will be emitted from the end 102 as a substantially coherent beam of light as indicated by the arrows 120. An R.F. field is applied to the electrode 116 as indicated by the arrow 122. The R.F. field can be applied to the electrode 116 by placing the laser 98 in a microwave cavity of the type shown in FIG. 1. This creates an acoustic wave in the piezoelectric portion 118 of the body. The acoustic wave travels across the end of the body and crosses the path of the light being emitted from the body so as to cause frequency modulation of the emitted light. Thus, the laser 98 is another device which requires both free carriers for the generation of light and a piezoelectric portion in which the free carriers are compensated to create an acoustic wave. By using the method of the present invention both of these functions can be achieved in a single body of the semiconductor material.

I claim:

1. A method of providing piezoelectric properties in a body of a crystalline semiconductor material which lacks a center of symmetry but which contains screening mobile electrons said method comprising bombarding a portion of said body with electrons until the mobile electrons in the bombarded portion of the body are sufficiently compensated to stimulate the latent piezoelectricity in said portion of the body.

2. The method in accordance with claim 1 in which the body is of a group III–V compound or mixture of said compounds.

3. The method in accordance with claim 2 in which the body contains a conductivity modifier.

4. The method in accordance with claim 1 wherein selected portions of the body are bombarded with electrons to provide a body having portions with semiconductive properties and portions with piezoelectric properties.

* * * * *